(12) United States Patent
Tsai et al.

(10) Patent No.: US 7,569,333 B2
(45) Date of Patent: Aug. 4, 2009

(54) WIRING LINE STRUCTURE AND METHOD FOR FORMING THE SAME

(75) Inventors: Tzeng-Guang Tsai, Hsinchu (TW); Kuo-Yu Huang, Hsinchu (TW); Hui-Fen Lin, Yunlin County (TW); Yu-Wei Liu, Taipei County (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 11/852,365

(22) Filed: Sep. 10, 2007

(65) Prior Publication Data

US 2008/0003527 A1    Jan. 3, 2008

Related U.S. Application Data

(62) Division of application No. 11/206,381, filed on Aug. 18, 2005.

(30) Foreign Application Priority Data

May 2, 2005    (TW) ................ 94114105 A

(51) Int. Cl.
  *G03F 7/00*    (2006.01)
  *G03C 5/00*    (2006.01)
  *C23C 28/00*    (2006.01)
(52) U.S. Cl. .............. 430/315; 430/317; 430/318; 430/323; 430/324; 430/5; 430/314

(58) Field of Classification Search .............. 430/324, 430/313, 314, 323, 5, 317, 318, 315; 438/597, 438/149

See application file for complete search history.

(56) References Cited

U.S. PATENT DOCUMENTS

| 4,464,459 | A  | * | 8/1984  | Majima et al. ............ 430/313 |
| 4,810,332 | A  | * | 3/1989  | Pan ............................ 205/125 |
| 6,627,523 | B2 |   | 9/2003  | Pyo |
| 6,969,889 | B2 |   | 11/2005 | Cho et al. |
| 2001/0023131 | A1 | * | 9/2001 | Wu et al. .................... 438/700 |
| 2004/0207084 | A1 | * | 10/2004 | Hedrick et al. ............ 257/751 |
| 2004/0232443 | A1 |   | 11/2004 | Cho et al. |
| 2005/0242401 | A1 |   | 11/2005 | Cho et al. |
| 2006/0124153 | A1 | * | 6/2006 | Yun et al. .................... 134/2 |

FOREIGN PATENT DOCUMENTS

CN    1610859    4/2005

\* cited by examiner

*Primary Examiner*—Mark F Huff
*Assistant Examiner*—Caleen O Sullivan
(74) *Attorney, Agent, or Firm*—Thomas, Kayden, Horstemeyer & Risley, LLP

(57) ABSTRACT

The wiring line structure comprises a transparent substrate, a barrier layer, a metal layer, and a photosensitive protecting layer. The barrier layer and a metal layer are successively disposed on the transparent substrate. The photosensitive protecting layer is formed on the barrier layer and both sides of the metal layer. A method for fabricating the wiring line structure is also disclosed.

23 Claims, 6 Drawing Sheets

US 7,569,333 B2

WIRING LINE STRUCTURE AND METHOD FOR FORMING THE SAME

CROSS REFERENCE TO RELATED APPLICATIONS

This application is a Divisional of application Ser. No. 11/206,381, filed Aug. 18, 2005 and entitled "WIRING LINE STRUCTURE AND METHOD FOR FORMING THE SAME", which is incorporated herein by reference.

BACKGROUND

The invention relates to a wiring line structure and, more particularly, to a wiring line structure on a transparent substrate and a method for fabricating the same, improving film coverage and simplifying process steps.

A typical liquid crystal display (LCD) includes a thin film transistor (TFT) substrate, a color filter (CF) substrate, and a liquid crystal layer disposed therebetween. The TFT substrate contains a plurality of matrix pixels consisting of a plurality of data lines and a plurality of scan lines, and a plurality of pixel driving circuits consisting of a plurality of electric devices, such as thin film transistors and capacitors. Traditionally, the line material (data line or scan line) for connecting to the transistors comprises Al, Cr, Mo, or W, wherein Al material with higher electric conductivity is commonly used as a gate line (scan line). However, increased size and resolution of LCDs requires reducing resistance-capacitance RC delay. Accordingly, there has been an increase in the use of copper with good electric conductivity as a wiring line material for LCD devices rather than aluminum.

It is, however, very difficult to etch a copper layer and to control the taper angle of the copper wiring line, resulting in reduction of film coverage in the subsequent deposition. Moreover, copper easily reacts with silicon, forming copper silicide (i.e. $Cu_3Si$), reducing device performance. Additionally, copper atoms easily diffuse in the silicon oxide, increasing current leakage. Moreover, the copper layer has poor adhesion strength with the underlying glass substrate. Accordingly, if copper is used as a wiring line material, the fabrication of LCD devices may become more difficult, reducing device performance and reliability.

SUMMARY

A wiring line structure and a method for fabricating the same are provided. An embodiment of a wiring line structure comprises a barrier layer formed on a transparent substrate, a metal layer and a photosensitive protecting layer. The barrier layer is disposed on the transparent substrate. The metal layer is disposed on the barrier layer. The photosensitive protecting layer is disposed on the barrier layer and both sides of the metal layer.

An embodiment of a method for fabricating a wiring line structure is provided. After forming a barrier layer on a transparent substrate, a photosensitive pattern layer is formed on the barrier layer, in which the photosensitive pattern layer comprises an opening exposing at least part of the barrier layer. A metal is filled into the opening. The photosensitive pattern layer is selectively removed to form a photosensitive protecting layer on both sides of the metal layer. The barrier layer uncovered by the photosensitive protecting layer and the metal layer is removed.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION

A wiring line structure for a display device is described in greater detail in the following.

Figure 1A:
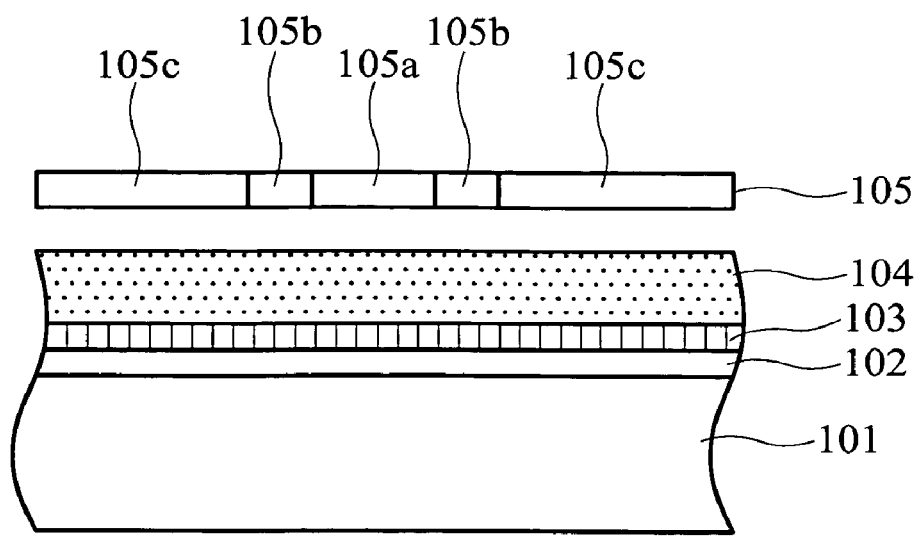
FIGS. 1A to 1E are cross-sections of an embodiment of a method for fabricating a wiring line structure on a transparent substrate of the present invention.
Figure 1B:
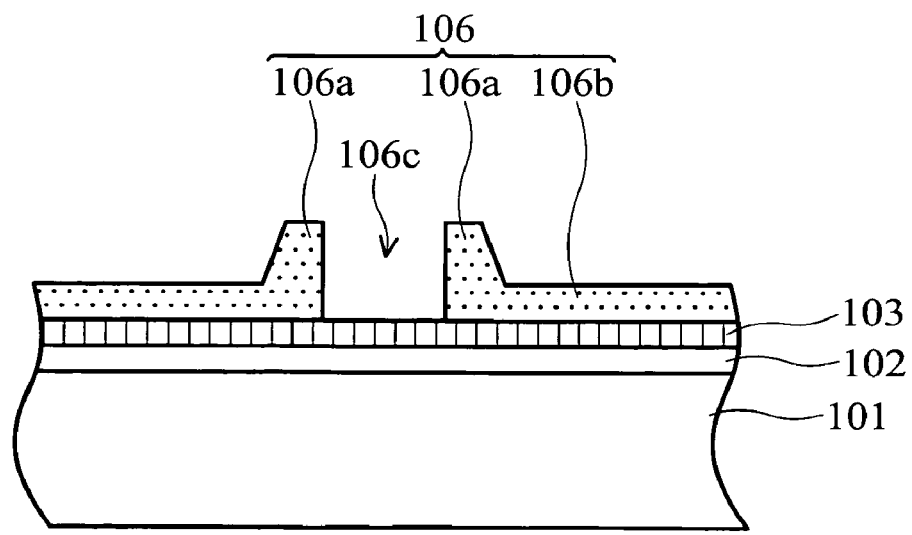
Figure 1C:
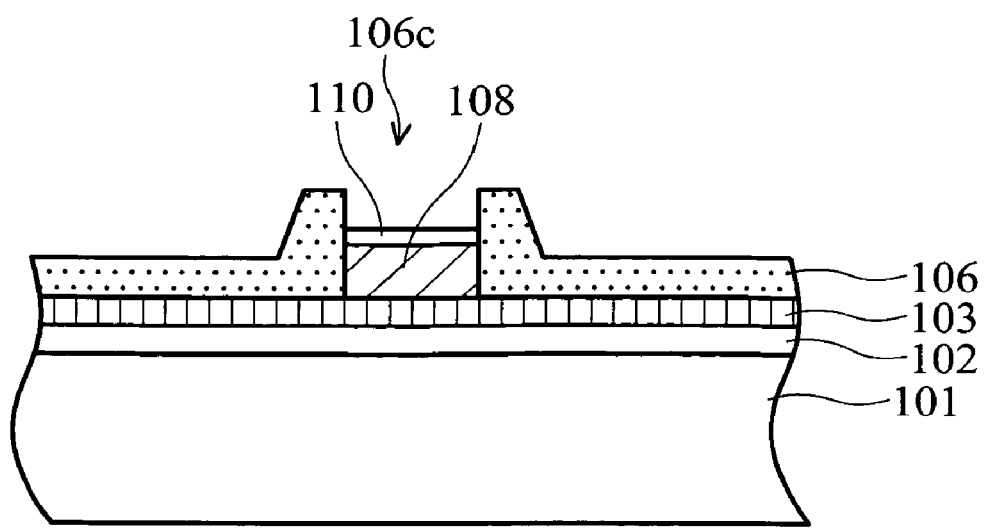
Figure 1D:
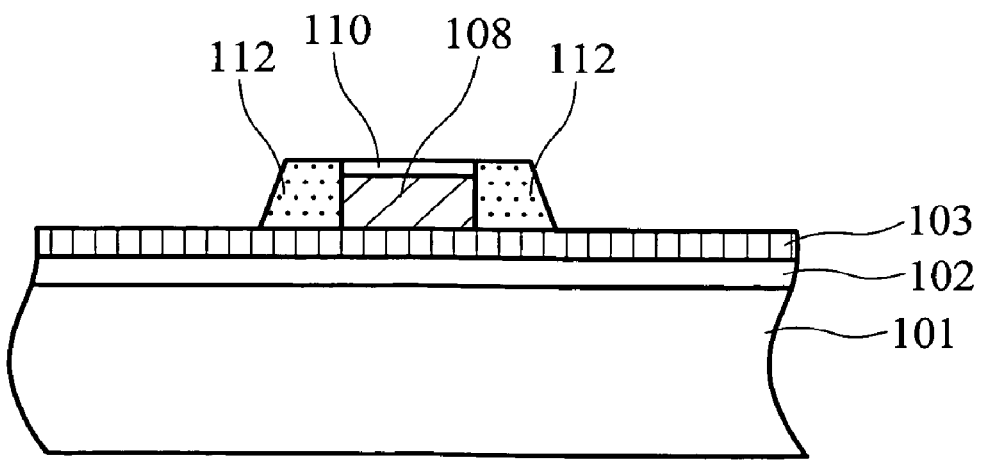
Figure 1E:
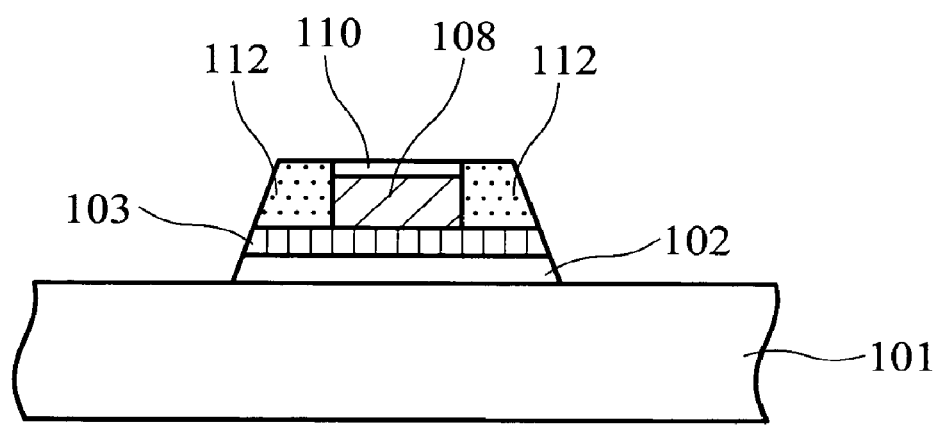

FIG. 1E illustrates a wiring line structure 100 formed on a transparent substrate for a display device, such as a LCD device, an electroluminescent display (ELD) device or other flat panel display devices. The wiring line structure 100 on a transparent substrate 101 comprises first and second barrier layers 102 and 110, a metal layer 108 and a photosensitive protecting layer 112. In the present embodiment of the invention, the first barrier layer 102 is disposed on the transparent substrate 101, comprising a conductive material, such as comprises Mo, W, Mo—W alloy, Cr, Ta, Ti, TiN, Ti—W alloy, Rh, Re, Ru, or Co. In some embodiments, the first barrier layer 102 may comprise an insulating material, such as an organic polymer or an inorganic material (for example, SiC, SiN, or metal oxide). The metal layer 108, such as a copper layer, is disposed on the first barrier layer 102. Additionally, an adhesion layer 103 may be optionally disposed between the first barrier layer 102 and the metal layer 108, comprising metal oxide, metal nitride, metal, or a combination thereof. For example, the metal oxide may comprise indium tin oxide (ITO), indium zinc oxide (IZO), aluminum-doped zinc oxide (AZO), cadmium tin oxide (CTO) or the like. The metal nitride may comprise tantalum nitride (TaN), titanium nitride (TiN) or the like. The metal may comprise Ta, Ti or the like. In the present embodiment of the invention, the second barrier layer 110 is disposed on the metal layer 108, comprising a conductive material. For example, the second barrier layer 110 may comprise at least one of Co and Ni. In some embodiments, the second barrier layer 110 may comprise an insulating material. The first and second barrier layers 102 and 110 and the metal layer 108 therebetween constitute a composite wiring line. The photosensitive protecting layer 112 is disposed on the first barrier layer 102 and both sides of the metal layer 108. The photosensitive protecting layer 112 may comprise a low dielectric constant (low-k) material. The dielectric constant of the low-k material ranges from about 2.7 to about 3.4. In the present embodiment of the invention, the photosensitive protecting layer 112 may comprise a polysilsesquiazane, such as photosensitive-methyl-silsesquiazane (PS-MSZ) or the like.

FIGS. 1A to 1E illustrate an embodiment of a method for fabricating a wiring line structure on a transparent substrate. In FIG. 1A, a transparent substrate 101, such as a glass substrate or a polymer substrate, is provided. After the transparent substrate 101 is cleaned, a first barrier layer 102 and a photosensitive layer 104 are successively formed thereon. In the present embodiment of the invention, the first barrier layer 102 may be formed by physical vapor deposition (PVD), chemical vapor deposition (CVD) or spin coating. The thickness of the first barrier layer 102 ranges from about 20 nm to about 200 nm. The first barrier layer 102 increases adhesion strength between the transparent substrate 101 and the metal wiring line. Additionally, an adhesion layer 103 may optionally be formed on the first barrier layer 102 prior to deposition of the photosensitive layer 104, thereby further improving adhesion strength between the transparent substrate 101 and the metal wiring line. The adhesion layer 103 may comprise metal oxide, metal nitride or metal. The photosensitive layer 104 may comprise a low k material, such as PS-MSZ or the like.

Lithography is performed on the photosensitive layer 104 using a mask 105, such as a half-tone mask, a slit-pattern mask, or a gray mask, to form a photosensitive pattern layer 106 on the adhesion layer 103 or the first barrier layer 102, having an opening 106c exposing at least part of the adhesion layer 103 or the first barrier layer 102, to define a wiring line region, as shown in FIG. 1B. The mask 105 shown in FIG. 1A comprises three transmission regions 105a, 105b and 105c with different transmittances, such that the photosensitive pattern layer 106 has a first portion 106a adjacent to the opening 106c and a second portion 106b laterally extending from thereof, in which the first portion 106a is thicker than the second portion 106b. For example, the transmittance of the transmission region 105a corresponding to the opening 106c can be higher than that of the transmission region 105c corresponding to the second portion 106b, and the transmittance of the transmission region 105c higher than that of the transmission region 105b corresponding to the first portion 106a. Here, the first portion 106a may have a thickness ranges from about 1000 nm to about 3000 nm and the thickness of second portion 106b can be substantially less than about 2500 nm.

In FIG. 1C, a metal layer 108, such as a copper layer, serving as a wiring line, is formed in the opening 106c by damascene method, eliminating copper etching problems. If the first barrier layer 102 comprises a conductive material, the copper layer 108 may be formed by electrochemical plating. Conversely, if the first barrier layer 102 comprises an insulating material, the copper layer 108 may be formed by electroless plating or chemical plating. In the present embodiment of the invention, the first barrier layer 102 comprises a conductive material and the copper layer 108 is formed by electrochemical plating, in which the copper layer 108 is thinner than the first portion 106a of the photosensitive pattern layer 106. As mentioned, copper easily reacts with silicon or easily diffuse in the silicon oxide. Moreover, copper may contaminate process tools in subsequent chemical deposition or dry etching due to its higher reactivity. Accordingly, a barrier layer must be formed on the copper layer 108. In the present embodiment of the invention, a second barrier layer 110 is formed on the copper layer 108 by electrochemical plating. The second barrier layer 110 may comprise at least one of Co and Ni. The thickness of the second barrier layer 110 ranges from about 5 nm to about 50 nm.

In FIG. 1D, the photosensitive pattern layer 106 is selectively removed to form a photosensitive protecting layer 112 on both sides of the copper layer, exposing the adhesion layer 103. In the present embodiment of the invention, the photosensitive protecting layer 112 may be formed by dry etching the photosensitive pattern layer 106 to different thicknesses. Here, the photosensitive protecting layer 112 has a tapered profile and a top surface substantially level with that of second barrier layer 110. The photosensitive protecting layer 112 with tapered profile can improve film coverage and increase the yield.

In FIG. 1E, the exposed adhesion layer 103 and the underlying first barrier layer 102 are successively removed using the photosensitive protecting layer 112 and the second barrier layer 110 as an etch mask, completing the fabrication of the wiring line structure 100 on the transparent substrate 101.

Figure 2A:
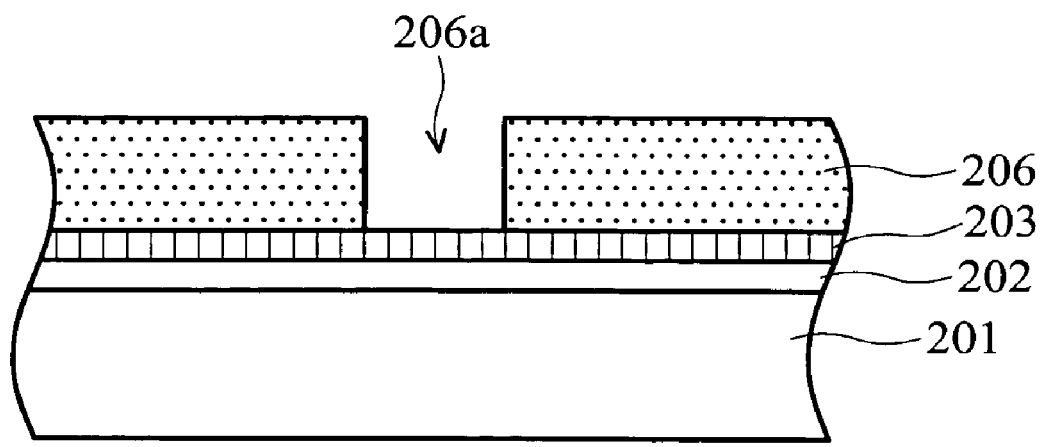
FIGS. 2A to 2F are cross-sections of an embodiment of a method for fabricating a wiring line structure on a transparent substrate of the present invention.

FIGS. 2A to 2F illustrate another embodiment of a method for fabricating a wiring line structure on a transparent substrate for a display device. In FIG. 2A, a transparent substrate 201, such as a glass substrate or a polymer substrate, is provided. After the transparent substrate 201 is cleaned, a first barrier layer 202 is formed thereon. In the present embodiment of the invention, the first barrier layer 202 may comprise Mo, W, Mo—W alloy, Cr, Ta, Ti, TiN, Ti—W alloy, Rh, Re, Ru, or Co. In some embodiments, the first barrier layer 202 may comprise an insulating material, such as an organic polymer or an inorganic material (for example, SiC, SiN, or metal oxide). Moreover, the first barrier layer 202 may be formed by PVD, CVD or spin coating. The thickness of the first barrier layer 202 ranges from about 20 nm to about 200 nm. The first barrier layer 202 increases adhesion strength between the transparent substrate 201 and the metal wiring line. Additionally, an adhesion layer 203 may be optionally formed on the first barrier layer 202, comprising metal oxide, metal nitride or metal, or combination thereof, thereby further improving adhesion strength. For example, the metal oxide may comprise ITO, IZO, AZO, CTO or the like. The metal nitride may comprise TaN, TiN or the like. The metal may comprise Ta, Ti or the like. A photosensitive pattern layer 206 is formed on the adhesion layer 203 or the first barrier layer 202, having an opening 206a exposing at least part of the adhesion layer 203 or the first barrier layer 202, to define a wiring line region. The photosensitive pattern layer 206 may comprise a low k material, such as PS-MSZ or the like.

Figure 2B:
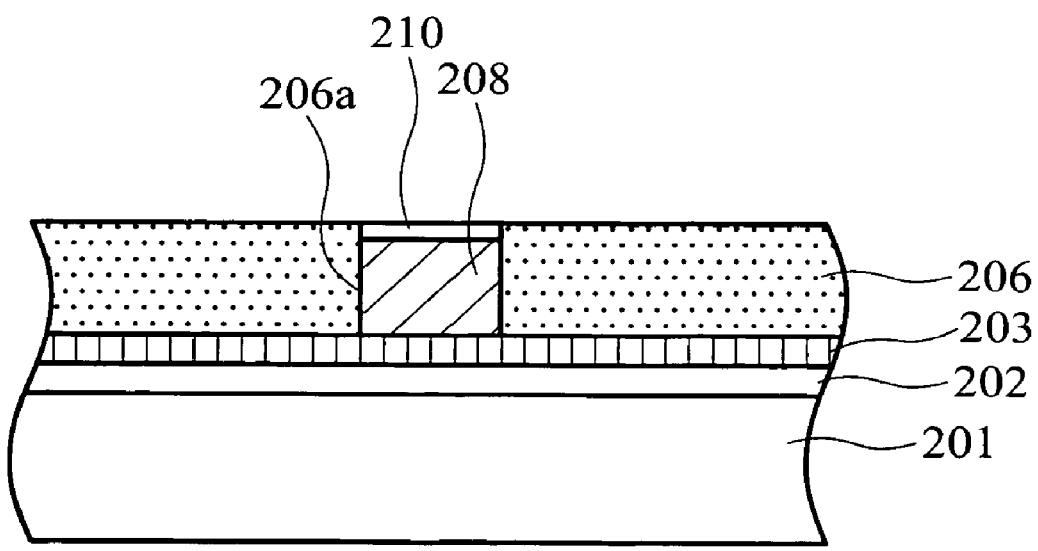

In FIG. 2B, a metal layer 208, such as a copper layer, serving as a wiring line, is formed in the opening 206a. If the first barrier layer 202 comprises a conductive material, the copper layer 208 may be formed by electrochemical plating. Conversely, if the first barrier layer 202 comprises an insulating material, the copper layer 208 may be formed by electroless plating or chemical plating. In the present embodiment of invention, the first barrier layer 202 comprises a conductive material and the copper layer 208 is formed by electrochemical plating, in which the copper layer 208 is thinner than the photosensitive pattern layer 206. A second barrier layer 210 is formed on the copper layer 208. In the present embodiment of the invention, the second barrier layer 210 is formed by electrochemical plating. The second barrier layer 210 may comprise at least one of Co and Ni. The thickness of the second barrier layer 210 ranges from about 5 nm to about 50 nm. Here, the top surface of the photosensitive pattern layer 206 is substantially level with that of the second barrier layer 210.

Figure 2C:
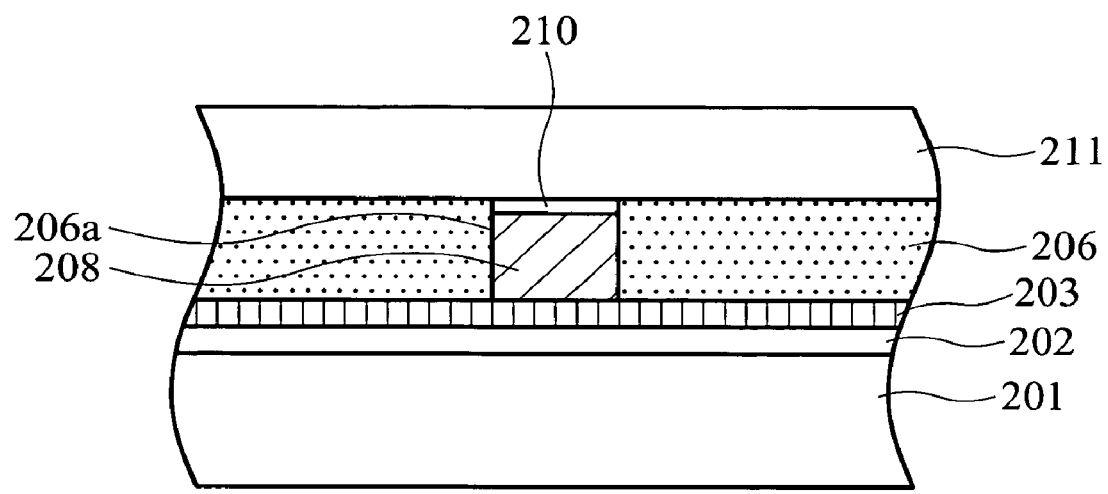
Figure 2D:
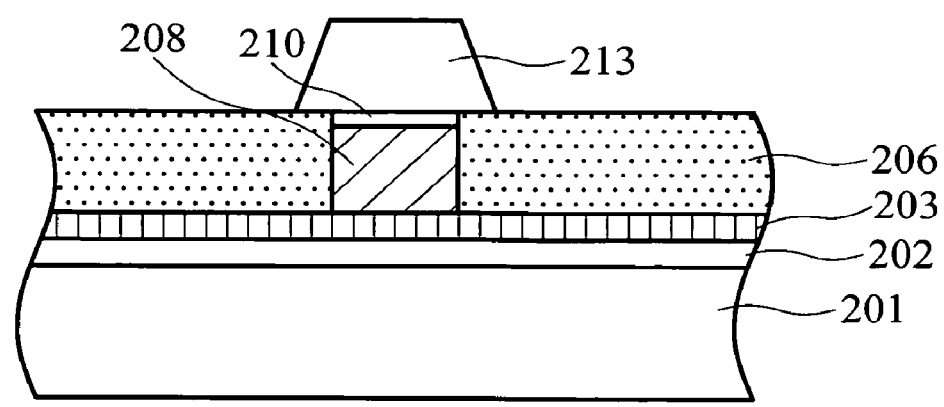

In FIG. 2C, a photoresist layer 211 is coated on the photosensitive pattern layer 206 and covers the second barrier layer 210 above the copper layer 208. Thereafter, the photoresist layer 211 is patterned to form an etch masking layer 213 covering the second barrier layer 208 and a portion of the photosensitive pattern layer 206 on both sides of the copper layer 208, as shown in FIG. 2D.

Figure 2E:
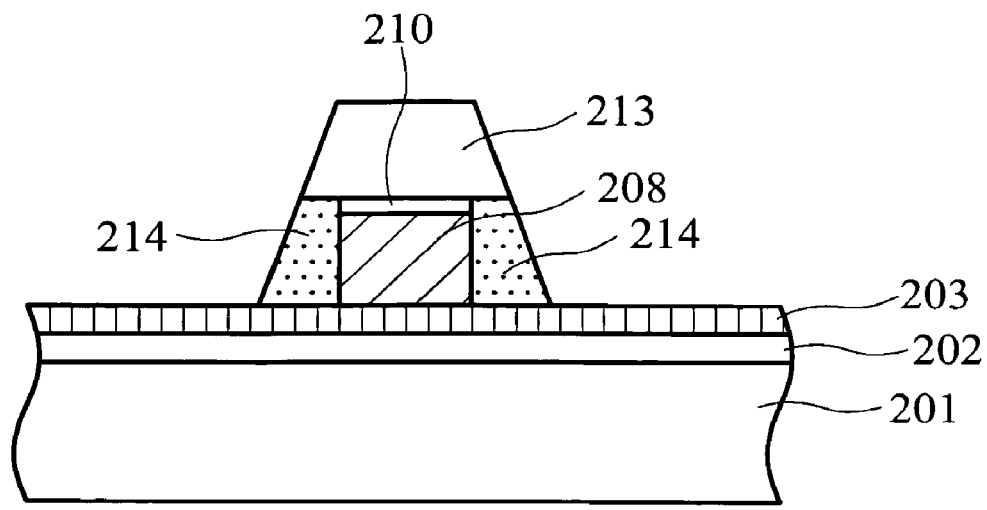

In FIG. 2E, the photosensitive pattern layer 206 uncovered by the etch masking layer 213 to form a photosensitive protecting layer 214 with tapered profile on both sides of the copper layer 208, exposing the adhesion layer 203.

Figure 2F:
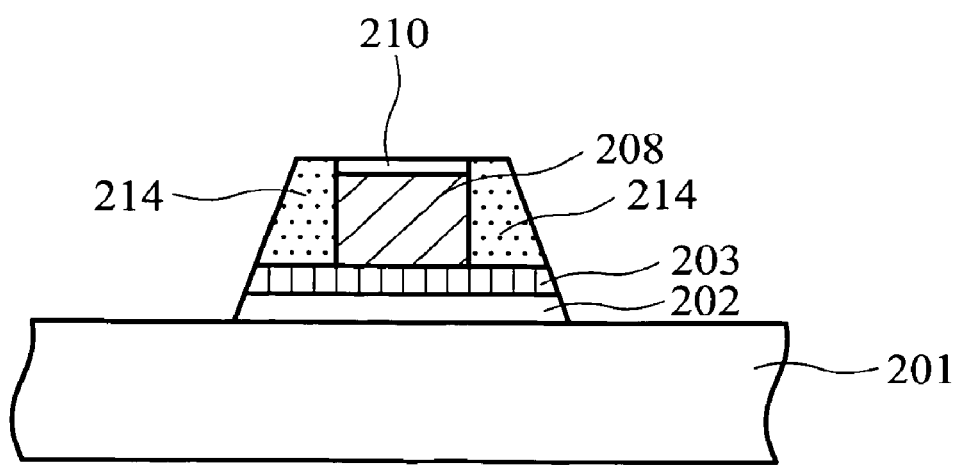

In FIG. 2F, after removing the etch masking layer 213, the exposed adhesion layer 203 and the underlying first barrier layer 202 are successively removed using the photosensitive protecting layer 214 and the second barrier layer 210 as etch masks, completing the fabrication of the wiring line structure 200.

Compared to conventional sputtering or deposition, the copper wiring line formed by electrochemical plating can effectively reduce fabrication costs. Moreover, barrier layers formed over and below the copper wiring line, respectively, improve adhesion strength between the wiring line and the underlying transparent substrate and between the wiring line and the overlying gate dielectric (silicon nitride) layer. Additionally, the formation of barrier layers also prevents copper from oxidization, diffusion, formation of silicide and contamination. The photosensitive protecting layer with tapered profile on both sides of the copper wiring line can improve the film coverage. Accordingly, the wiring line assembly of the invention simplifies processes, reduces fabrication cost and increase device reliability.

While the invention has been described by way of example and in terms of preferred embodiment, it is to be understood that the present invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A method for fabricating a wiring line structure, comprising:
   forming a first barrier layer on a transparent substrate;
   forming a photosensitive pattern layer on the first barrier layer, the photosensitive pattern layer comprising an opening to expose at least part of the first barrier layer;
   filling a metal layer into the opening;
   selectively removing the photosensitive pattern layer to form a photosensitive protecting layer on both sides of the metal layer; and
   removing the first barrier layer uncovered by the photosensitive protecting layer and the metal layer.

2. The method of claim 1, wherein formation of the photosensitive pattern layer comprises:
   forming a photosensitive layer on the first barrier layer; and
   patterning the photosensitive layer to form the opening therein;
   wherein the photosensitive pattern layer comprises a first portion adjacent to the opening and thicker than a second portion laterally extending therefrom.

3. The method of claim 2, wherein the thickness of the first portion of the photosensitive pattern layer ranges from about 1000 nm to about 3000 nm.

4. The method of claim 2, wherein the thickness of the second portion of the photosensitive pattern layer is substantially less than about 2500 nm.

5. The method of claim 1, wherein the metal layer is formed in the opening by electrochemical plating.

6. The method of claim 1, wherein the photosensitive pattern layer is formed using a half-tone mask, a slit-pattern mask, or a gray mask.

7. The method of claim 1, wherein the thickness of the first barrier layer ranges from about 20 nm to about 200 nm.

8. The method of claim 1, wherein the first barrier layer comprises Mo, W, Mo—W alloy, Cr, Ta, Ti, TiN, Ti—W alloy, Rh, Re, Ru, or Co.

9. The method of claim 1, wherein the first barrier layer comprises an insulating material.

10. The method of claim 1, further comprising forming a second barrier layer on the metal layer.

11. The method of claim 10, wherein the thickness of the second barrier layer ranges from about 5 nm to about 50 nm.

12. The method of claim 10, wherein the second barrier layer comprises at least one of Co and Ni.

13. The method of claim 10, wherein the second barrier layer is formed on the metal layer by electrochemical plating.

14. The method of claim 1, wherein the metal layer comprises Cu.

15. The method of claim 1, wherein the photosensitive protecting layer comprises a low dielectric constant (low-k) material, and the dielectric constant of the low-k material ranges from about 2.7 to about 3.4.

16. The method of claim 1, wherein the photosensitive protecting layer comprises polysilsesquiazane.

17. The method of claim 1, wherein the selective removal of the photosensitive pattern layer comprises:
   forming a photoresist layer on the photosensitive pattern layer and the metal layer;
   patterning the photoresist layer to form an etch masking layer covering the metal layer and a portion of the photosensitive pattern layer on both sides thereof; and
   removing the photosensitive pattern layer uncovered by the etch masking layer.

18. The method of claim 17, further comprising forming a second barrier layer on the metal layer.

19. The method of claim 18, wherein the thickness of the second barrier layer ranges from about 5 nm to about 50 nm.

20. The method of claim 18, wherein the second barrier layer comprises at least one of Co and Ni.

21. The method of claim 18, wherein the second barrier layer is formed on the metal layer by electrochemical plating.

22. The method of claim 1, further comprising forming an adhesion layer between the first barrier layer and metal layer.

23. The method of claim 22, wherein the adhesion layer comprises metal oxide, metal nitride, metal, or a combination thereof.

* * * * *